United States Patent [19]
Forrest et al.

[11] Patent Number: 6,005,276
[45] Date of Patent: Dec. 21, 1999

[54] SOLID STATE PHOTODETECTOR WITH LIGHT-RESPONSIVE REAR FACE

[75] Inventors: Roger W. Forrest, Thousand Oaks; Harold S. Melkonian, Ventura, both of Calif.

[73] Assignee: Advanced Photonix, Inc., Camarillo, Calif.

[21] Appl. No.: 08/968,546

[22] Filed: Nov. 12, 1997

[51] Int. Cl.$^6$ ............... H01L 31/0232; H01L 31/0203
[52] U.S. Cl. ............... 257/432; 257/433; 257/459; 257/461; 257/434
[58] Field of Search ............... 257/432, 433, 257/434, 680, 431, 448, 457, 459, 461

[56] References Cited

U.S. PATENT DOCUMENTS

| 5,600,173 | 2/1997 | Suzunaga | 257/459 |
| 5,668,386 | 9/1997 | Makiuchi et al. | 257/459 |
| 5,801,430 | 9/1998 | Forrest et al. | 257/434 |
| 5,852,322 | 12/1998 | Speckbacher | 257/459 |

*Primary Examiner*—Minh Loan Tran
*Attorney, Agent, or Firm*—Knobbe Martens Olson & Bear, LLP

[57] ABSTRACT

A semiconductor photodiode is configured to have its rear face light responsive with electrical contacts formed on the front face. The photodiode can be surface mounted, such as by solder, upon a carrier with the light responsive rear face up. An integral filter over the rear face confines light reaching the semiconductor substrate to desired wavelengths. In one embodiment, the photodiode also includes integral opaque layers over the front and rear faces of the substrate. The rear opaque layer includes an aperture to allow light to strike the rear face adjacent an active region. In another embodiment, the photodiode is configured for double-sided light sensitivity, and the front side faces an aperture through the carrier.

25 Claims, 7 Drawing Sheets

SOLID STATE PHOTODETECTOR WITH LIGHT-RESPONSIVE REAR FACE

FIELD OF THE INVENTION

This invention relates to semiconductor photodiodes having a rear side, light responsive face.

BACKGROUND OF THE INVENTION

Semiconductor photodiodes are well known and commercially available. Typically, such a photodiode has a PN-junction formed adjacent to a front face of the device with electrodes formed on that face. The rear face of the photodiodes includes an opaque electrical contact.

Photodiodes having light responsive rear faces also have been made for a variety of applications, mostly military. Such devices have opaque surface layers on the front face precluding the possibility of light reaching that face. The rear face also includes electrodes. The devices are quadrature devices having four discrete sensor areas and are used, for example, for laser guided missile controls.

Deposited surface filters for photodiodes also are disclosed in U.S. Pat. No. 4,158,133 for front face wavelength adjustment of incident light. There is no showing of rear face filter usage or use of both front and rear face light response with or without filters on one of or both such faces.

SUMMARY OF THE INVENTION

In accordance with one aspect of the invention, a surface mounted semiconductor photodiode is provided on a circuit carrier. The photodiode includes a light sensitive semiconductor substrate, with an integral light filter extending across the rear surface of the substrate. Two or more electrodes extend from the front surface of the substrate and are bonded to circuit elements on the surface of the carrier. The photodiode is thus surface mounted with its light sensitive rear face facing away from the carrier, with an integral filter over the rear face to accept incident light of desired wavelengths.

In accordance with another aspect of the invention, a method is provided for forming a surface mounted photodiode. A light sensitive semiconductor substrate is provided. A plurality of electrodes are formed on the front face of the substrate, and a filter is deposited on the rear face of the substrate. The electrodes are adhered with conductive adhesive to a plurality of circuit elements on a circuit carrier.

In accordance with another aspect of the invention, a semiconductor photodiode is mounted upon a circuit carrier. The photodiode has a light-sensitive semiconductor substrate with a front face and a rear face. An integral light filter extends across the rear face, while an electrically-doped active region is formed at the front face. In its mounted configuration, the active region aligns with and is in optically communication with an aperture formed through the carrier.

BRIEF DESCRIPTION OF THE DRAWINGS

These and other aspects of the illustrative embodiment will be apparent from the accompanying drawings, which are meant to be illustrative and not limiting, and in which.

DETAILED DESCRIPTION OF THE PREFERRED EMBODIMENT

Figure 1:
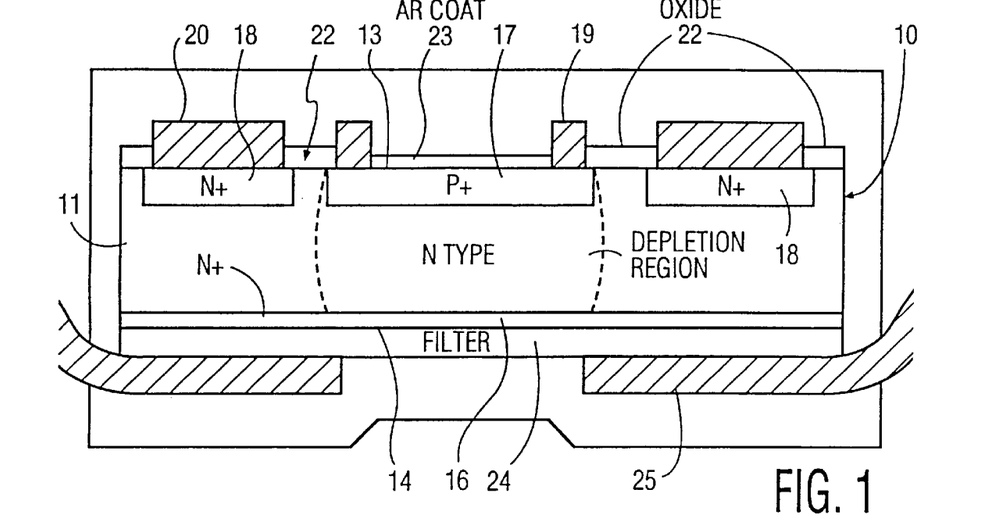
FIGS. 1 and 2 are a schematic cross-section and top view, respectively, of a double-sided photodiode in accordance with the principles of this invention.
Figure 2:
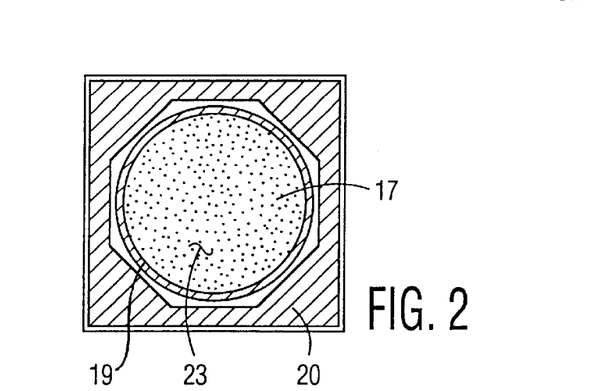

FIG. 1 shows a schematic cross-section of a photodiode 10 in accordance with the principles of this invention. The photodiode includes an N-type body region 11 having front and rear faces 13 and 14 respectively. The rear face includes an N+ surface layer 16 extending over the entire rear face. The front face, 13, includes a P+ surface region 17 and an N+ region 18. In the illustrated embodiment, the P+ region is circular and the N+ region encompasses the P+ surface region, although it will be understood that other geometric arrangements are also possible. Electrodes 19 and 20 are formed on front surface 13 and are connected to P+ region 17 and to N+ region 18 respectively. The surface area between electrodes 19 and 20 can be passivated, typically with a thermally grown $SiO_2$ layer 22, as shown. The area encompassed by electrode 19 is coated with anti-reflective coating 23 in the embodiment of FIG. 2.

The rear face 14 of photodiode 11 is covered with a filter 24 which adjusts the wavelength characteristics of light on the rear face 14. The illustrated rear face 14 also includes a metal framing layer 25 which provides mechanical stability to the device.

Figure 3:
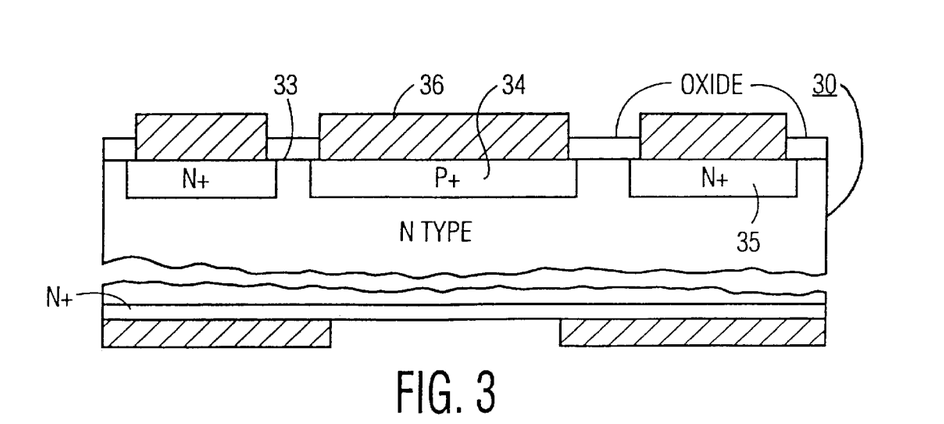
FIG. 3 is a schematic cross-section of a photodiode of the type shown in FIG. 1 with the front face occluded.

FIG. 3 shows a portion of a photodiode 30 of the type shown in FIG. 1, including a front surface 33 illustrated with a central, circular P+ region 34 and an encompassing N+ region 35. In this embodiment, a metal layer 36, serving as an electrode, covers the entire P+ region, thus preventing light from reaching the front face of the photodiode. Such a device need not have a filter on the rear face as shown in FIG. 3, as is also true of an embodiment of the type shown on FIG. 1.

Figure 4A:
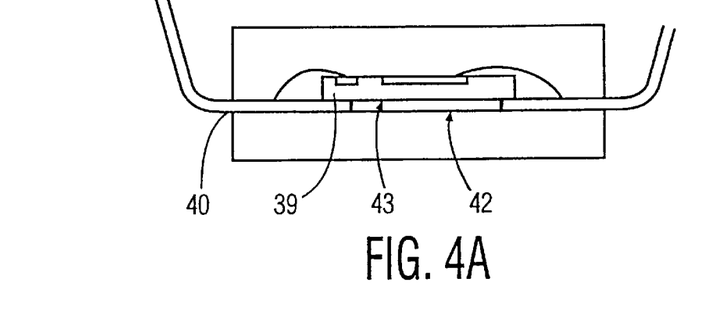
FIGS. 4A and 4B are schematic side views of a photodiode of the type shown in FIG. 1 mounted on a conductor trace and on a flexible circuit with a stiffener, respectively.
Figure 4B:
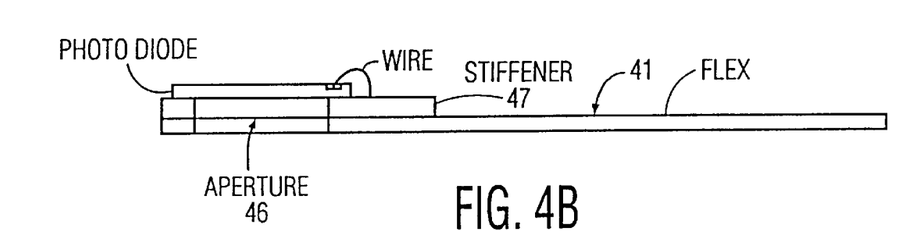

FIGS. 4A and 4B show two embodiments where a sensor is mounted on a rigid lead frame and on a flexible circuit, respectively.

FIG. 4A shows an embodiment where a rear face, light sensitive photodiode 39 is positioned face down on a rigid lead frame, which includes an aperture to permit light to reach the rear face. The lead frame is designated 40 in FIG. 4A but may comprise a flexible carrier of, for example, Kapton with metal traces on the surface 41 as viewed in FIG. 4B. The aperture is designated 42 in FIG. 4A, allowing light to reach rear face 43. The aperture is designated 46 in FIG. 4B. The arrangement shown in FIG. 4B permits a low profile sensor to be mounted electrically in a manner to permit relatively high sensitivity at relatively low cost where the rear face is free of incumbrance (i.e., electrodes) for ease of deposition of a filter.

Figure 5:
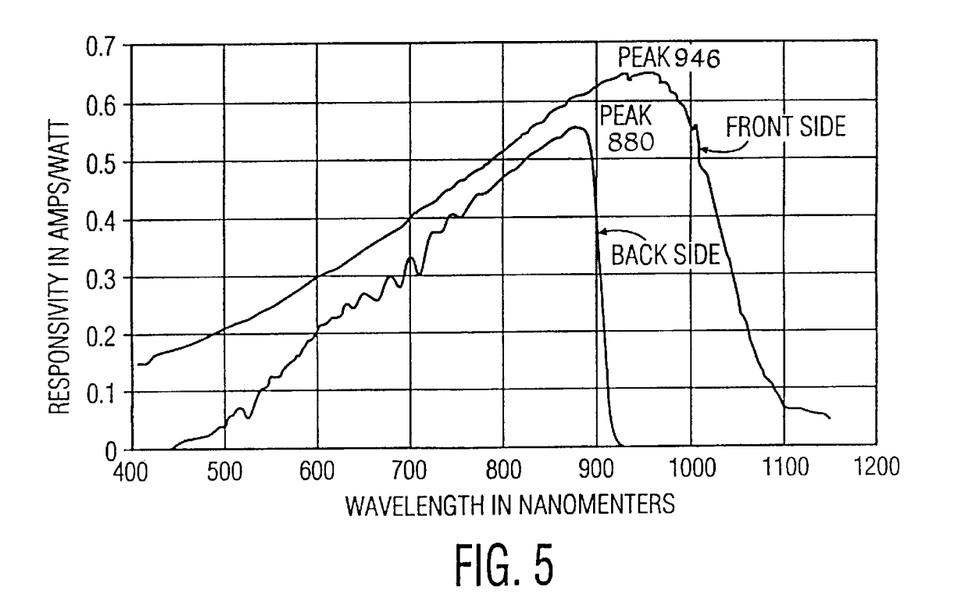
FIG. 5 is a responsivity curve for the photodiodes of FIG. 1.

FIG. 5 is a typical plot of silicon sensitivity, plotting responsivity in amperes per watt versus wavelength in nanometers. It is clear from the figure that the front face wavelength distribution extends from less than 400 nanometers to over eleven-hundred with a peak at 946 nanometers. The rear face wavelength distribution extends from about 450 nanometers to about 930 nanometers with a peak at about 880 nanometers. A typical rear face filter of a combination of silicon-oxides and metallic-oxides changes the wavelength distribution of incident (white) light to more closely match the rear face curve of FIG. 5, as will be understood by one of skill in the art of optical filtration.

Figure 6:
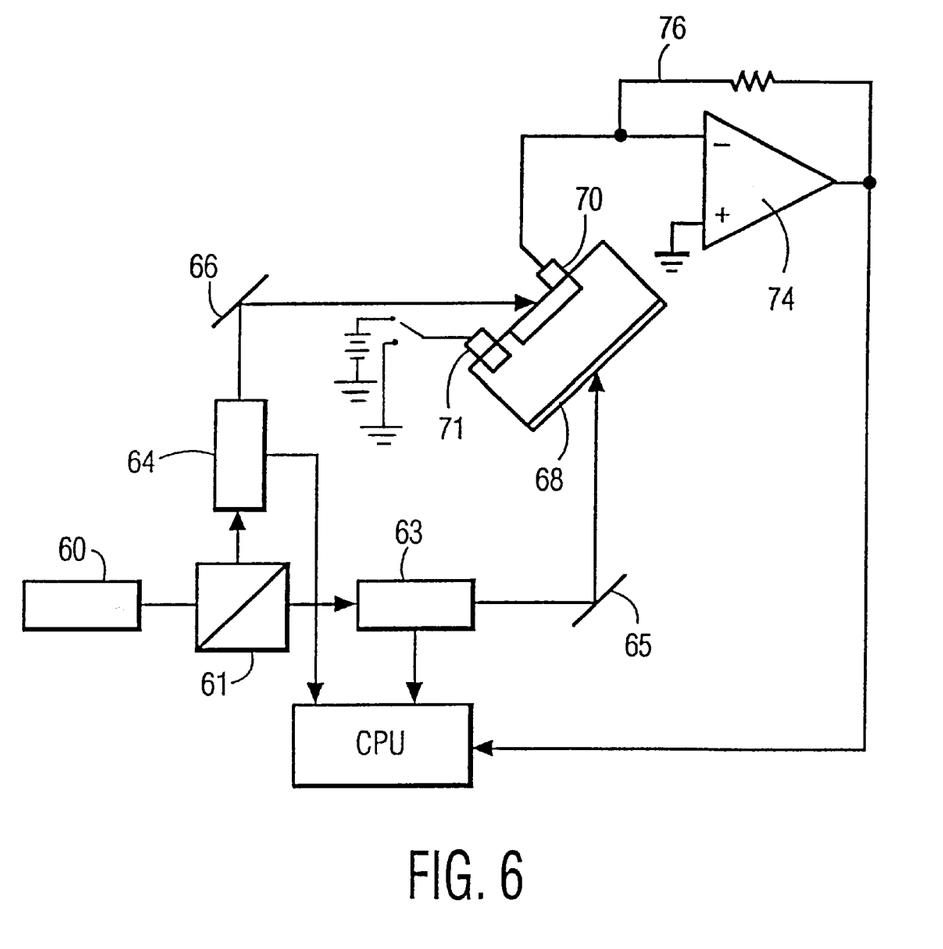
FIG. 6 is a system schematic for an application of the two-sided photodiode of FIG. 1.

FIG. 6 shows a schematic of a system which employs a two-sided, light responsive device of the type shown in FIG. 1. The system employs a light source 60 directing light at beam (or color) splitter 61. Splitter 61 diverts light into modulators 63 and 64 to mirrors 65 and 66, respectively. Mirrors 65 and 66 direct light to the rear face and to the front face of two sided photodiode 68. Photodiode 68 includes an electrode 70 connected to the P+ surface region (see 19 of FIG. 1) and an electrode 71 connected to the N+ region (see 18 of FIG. 1). Electrode 71 is connected to ground as shown in FIG. 6, or can be operated at a reverse bias in other arrangements. Electrode 70 is connected to the negative input of an inverting amplifier 74. The positive input of amplifier 74 is connected to ground. A feedback loop 76 connects the amplifier output to the negative input. This system implements a data path adjusted with respect to a reference path by a single photodiode and may be used, for example, to adjust various systems correcting, on-the-fly, any unwanted drift characteristic of the system. A prior art system of this type employs two photodiodes each connected to its own amplifier, the outputs of which are connected to inputs of a comparator. Such a system was disclosed, for example, at the seventh International Symposium of IMEKO Technical Committee on Photon-Detectors, Braunschweig, West Germany, May 17–19, 1976 in a paper entitled "*Spectral Radiometry, A New Approach Based on Electro-Optics*" by J. Geist, M. A. Lind, R. Schoefer, and E. F. Salewski. A significant cost advantage is achieved when compared to such prior art systems.

A photodiode in accordance with one embodiment has very low capacitance (<or equal 5 pfd @ 15 Volts) and a high frequency of operation (<or equal 8 ns rise/fall time) and has the responsivity curve of FIG. 5 on the front face.

Figure 7:
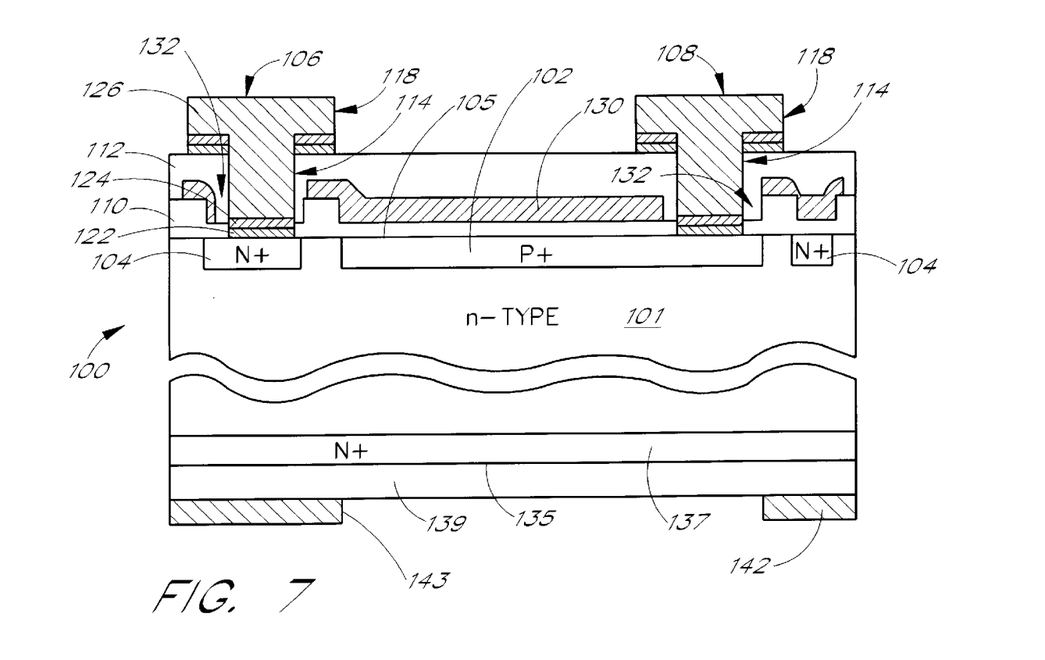
FIG. 7 is a schematic cross-section of a photodiode constructed in accordance with a surface mount embodiment.
Figure 8:
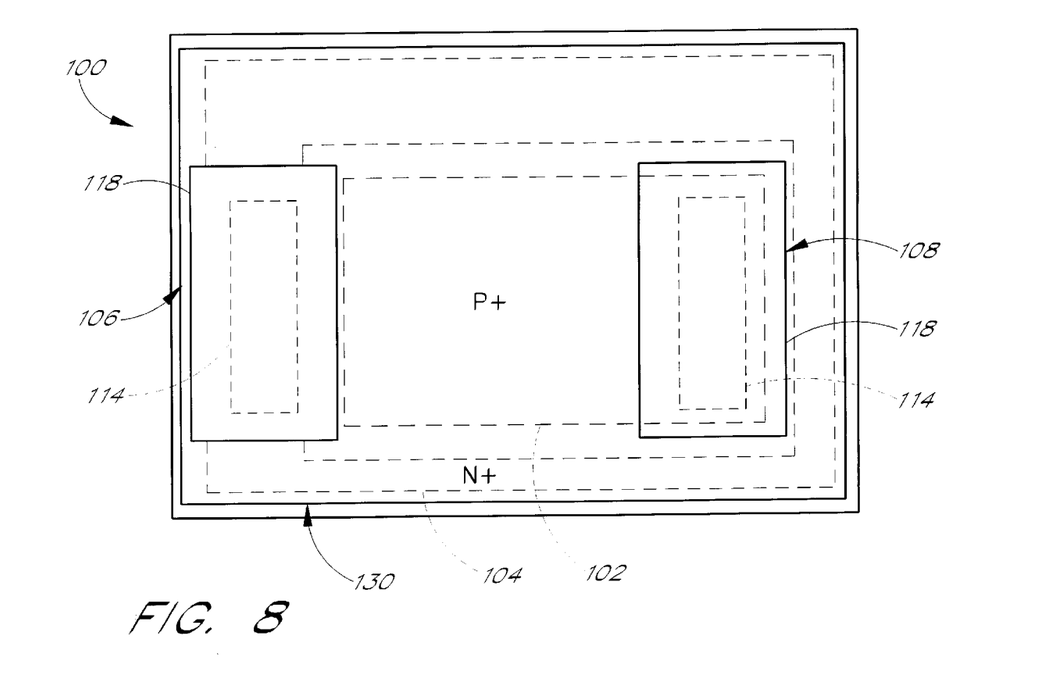
FIG. 8 is a top plan view of the photodiode of FIG. 7.

FIGS. 7 and 8 illustrate a photodiode 100 in accordance with another embodiment. As with the embodiments of FIGS. 1 and 3, the photodiode 100 comprises a semiconductor substrate 101, desirably formed of n-type silicon. It will be understood that, for other arrangements, the silicon can be p-type, and the conductivity of other regions discussed below would be reversed. The silicon substrate 101 is responsive to light with wavelengths in the range of about 200 nm to 1,200 nm. The substrate 101 has a thickness suitable for light-responsive rear face applications, preferably less than about 0.011 inch. The illustrated substrate has a thickness of about 0.008 inch (203 $\mu$m).

The substrate 101 comprises a heavily doped active region 102, which forms a PN junction with the surrounding intrinsic silicon of the substrate 101, and a heavily doped contact region 104 of the same conductivity type as the surrounding intrinsic silicon. Each of these regions 102, 104 are formed at a front face 105 of the substrate 101. In the illustrated embodiment, these regions take the form of a central P+ region 102 and an encompassing N+ region 104. It will be understood that other diode and contact configurations are also possible (e.g., the N+ region need not surround the P+ region), and that the conductivity types can be reversed, as noted above.

Typically, the regions 102 and 104 are heavily doped (e.g., about $10^{19}$ atoms/cm$^3$) to a depth of about 1 $\mu$m, while the doped regions are separated by about 200 to 300 $\mu$m. Note that the figures are not drawn to scale.

The photodiode 100 is illustrated with a configuration advantageous for surface mounting upon a carrier. In particular, the P+ region 102 extends asymmetrically further to the right than to the left (from the sectional view of FIG. 7), while the surrounding N+ region 104 is made more narrow on the right side. In contrast to the annular electrodes shown in FIGS. 1 and 3, an electrode 106 makes contact to only one side of the annular N+ region 104, while a second electrode 108 is positioned at a distal end of the P+ region 102. The illustrated arrangement of the electrodes 106, 108 is advantageous for proper alignment of the contacts during surface mounting, while minimizing risk of shorting the electrodes.

Each of the electrodes 106, 108 extends through one or more layers of insulating material 110, 112 to make electrical contact with the front face 105 of the substrate 101. In the illustrated embodiment, the lower insulating layer 110 includes field oxide regions between and outside doped areas and a relatively thinner insulating or passivating layer over doped areas. Desirably, each of the electrodes has a T-shaped configuration, with a relatively narrow contact portion 114 extending through the insulating material 110, 112 and a wider cap portion 118 overlying the insulating layer 112.

The electrodes preferably include multiple conductive layers. Specifically, the illustrated electrodes 106, 108 comprise a titanium (Ti) layer 122 in direct contact with the substrate front face 105 and over a horizontal portion of the insulating layer 112; a palladium (Pd) layer 124 overlying and contacting the Ti layer 122; and a silver (Ag) layer 126 overlying and contacting the Pd layer 124. This sequence of layers provides good adhesion and electrical contact among the various materials.

The illustrated embodiment also includes an opaque layer 130, preferably comprising a metal layer embedded within the insulating layer(s) 110, 112 over the photodiode front face 105. The preferred opaque layer 130 comprises a sufficiently thick layer of aluminum (Al) to prevent light from reaching the front face 105 of the substrate 101. The Al layer 130 of the illustrated embodiment is about 5,000 Å thick. It will be understood that, in alternative arrangements, the light blocking function can be served by one of the insulating layers, if an appropriately opaque insulating material is utilized.

As shown, the Al layer 130 includes openings wide enough to allow the contact portion 114 of each electrode 106, 108 to extend through without shorting the electrodes 106, 108 to one another. A spacing or gap 132 surrounding each electrodes 106, 108 separates the contact portion 114 of each electrode from the surrounding Al layer 130. In the illustrated embodiment, the gap 132 is between 50 $\mu$m and 100 $\mu$m in width. While this spacing 132 would otherwise allow some light to leak to the front face 101, the wider cap portion 118 of each electrode overlaps with and creates a shadow over the open gaps 132, thereby minimizing any light leakage. The greater width of the cap portions 118 additionally facilitates alignment of the electrodes 106, 108 during surface mounting upon a carrier with electrical circuits, as will be described further with respect to FIG. 10.

A rear face 135 of the substrate 101 is defined as the side of the substrate opposite that of the N+ contact region 104 and the P+ active region 102 to which the electrodes 106 and 108, respectively, make contact. Advantageously, an N+ depletion stop region 137 extends across the rear face 135, at least in a region adjacent the P+ region 102 on the front face 105. This region 137 lowers the potential for leakage currents due to surface recombination, and serves as a stop for the depletion region. In the illustrated embodiment, the depletion stop 137 extends across the entire rear face 135.

An optical filter 139 is formed over the rear face 135, at least in a region adjacent the P+ region 102 on the front face 105. As with the N+ region 137, the illustrated filter 139 extends over the entire rear face 135. Typical filter materials include dielectric stacks (e.g., silicon oxides, metal oxides, etc.) and/or semireflective metallic layers. The filter 139 preferably comprises an environmentally stable hard material to protect the photodiode 100 from the environment of use, most preferably comprising metallic or silicon oxide directly deposited over the substrate rear face 135, to form an integral part of the photodiode 100.

The filter 139 serves to confine light reaching the substrate 101 to those wavelengths of interest. For example, the illustrated photodiode 100 can be constructed to permit 80% of light with wavelengths in the range of 700 to 750 nm. Preferably, the filter 139 blocks light outside the wavelengths of interest down to a transmission rate of about 0.1% to 1%. Such a filter optimally detects wavelengths produced by laser diodes with 710 nm emitters, such as may be used in bar code scanners. Filters suitable for different bandwidths and transmission requirements for particular applications can be provided by a variety of optical filter companies that provide optical coatings, and preferably hard optical coatings. For the preferred silicon substrate 101, which can be sensitive to light from about 200 nm to about 1,100 nm, the filter 139 can be configured to be sensitive to light emissions from sources such as HeNe lasers, GaAlAs LEDs and laser diodes, GaAs LEDs and laser diodes, or ND:YAG lasers.

The photodiode 100 can also include a rear face opaque layer 142, as shown, with a window or aperture 143 formed therein. Like the preferred front opaque layer 130, this layer 142 is preferably also a deposited metal layer, forming an integral part of the photodiode 100. Alternatively, the light blocking function can be provided by an independent bracket with an aperture therein, to be applied over the filter 139 when the photodiode is in its operational configuration. This layer 142 advantageously restricts light striking the rear face 135 of the substrate 101 to the region defined by the aperture 143 adjacent the P+ active region 102, thereby improving response time of the photodiode 100.

Figure 9:
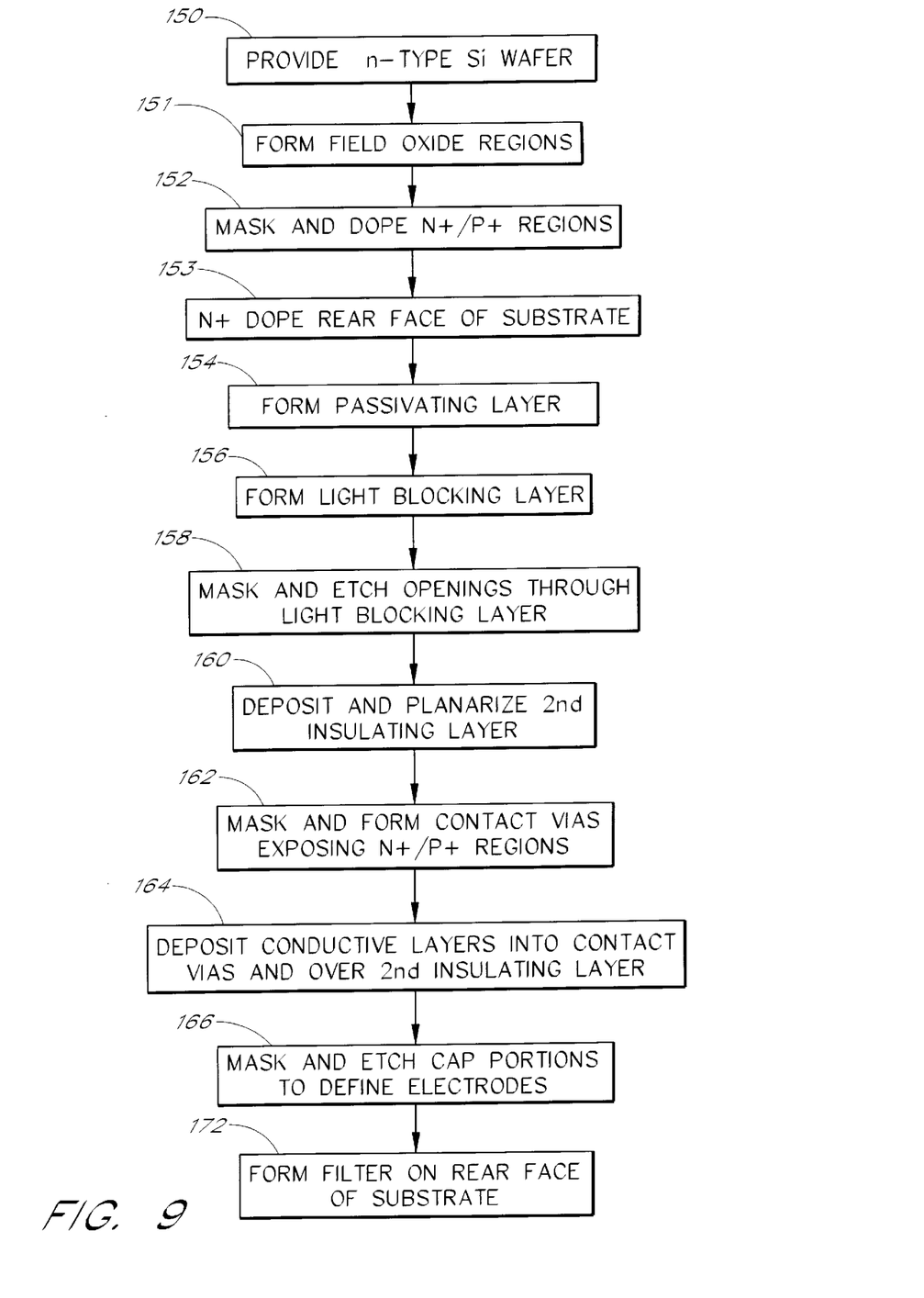
FIG. 9 is a flow chart generally illustrating a fabrication process for manufacturing the photodiode of FIG. 7.

FIG. 9 is flow chart showing the general steps involved in fabricating the photodiode 100 of FIGS. 7–8. A silicon substrate is first provided, as indicated at step 150. Field oxide regions are formed 151 on the front surface of the substrate, in regions which are not to be doped. In the illustrated embodiment, the field oxide is grown uniformly across the wafer front surface, and regions to be doped are etched away. Alternatively, it will be understood by one of skill in the art that field oxide can be formed by growing oxide in selective regions through a mask, or by trench and dielectric fill.

The N+ and P+ regions can be formed 152 upon the wafer front face 105 (FIG. 7) in a conventional manner, including masking and doping with appropriate dopants. The field oxide regions can form at least a part of the mask, while additional masking portions permit separately doping different regions with dopants of different conductivity type. In the illustrated embodiment, doping 152 comprises saturating the N+ contact region 104 (FIG. 7) with about $10^{19}$ atoms/cm$^3$ of n-type dopants (generally phosphorus, arsenic or antimony) by any suitable process, preferably by implantation. The P+ active region 102 (FIG. 7) is similarly heavily doped with p-type dopants (generally boron).

The rear face can then be doped 153 with a shallow N+ surface layer. The skilled artisan will recognize that this step, as well as many others in the process flow, can be performed in a different sequence than that shown in FIG. 9. It is preferable, however, to dope 153 the rear face prior to any metallization. Desirably, the surface layer is heavily doped with n-type dopants, such as with about $10^{17}$ atoms/cm$^3$ of phosphorus.

Steps 154 through 166 represent a preferred sequence of steps in forming the electrodes 106, 108 of the embodiment illustrated in FIG. 7, which is advantageous for surface-mounting the photodiode 100. As indicated, an insulating or passivating layer is formed 154 over the front surface. An exemplary passivating layer forming step 154 comprises thermally growing about 3,500 Å of silicon dioxide upon the substrate front surface. It will be understood, however, that the insulating layer can also be deposited in other arrangements. The preferred thermally grown passivating layer, in combination with the field oxide regions grown in step 151, completes the first insulating layer 110 shown in FIG. 7.

Following formation 154 of the passivating layer, a front light blocking or opaque layer can optionally be formed 156. As noted above, the light blocking layer comprises a material of sufficient thickness to be opaque, such as the exemplary 3,500 Å aluminum layer 130 (FIG. 7). With the front opaque layer, electrode contact must be made through both the front opaque layer and the passivating or insulating layer. Since the illustrated front opaque layer comprises a highly conductive metal, the electrodes should not electrically contact the opaque layer. Accordingly, the opaque layer is masked and etched 158 with a relatively wide opening (e.g., 0.010 inch by 0.100 inch), followed by deposition and planarization 160 of a second insulating layer 112 (FIG. 7), such as about 5,500 Å of deposited silicon dioxide. The latter step 160 results in embedding the front opaque layer 130, including contact openings therein, within insulating material.

Contact vias are then formed 162, such as by conventional mask and etch processes, through the insulating layers and the opening of the optional opaque layer, to expose portions of the N+ and P+ doped regions. Where the opaque layer comprises a conductive material, the vias should each be formed more narrow than the openings through the opaque layer. In the illustrated example, where the openings are about 0.010 inch by 0.100 inch, the contact vias are about 0.006 inch by 0.080 inch.

Conductive layers are next deposited 164 into the contact vias and over the insulating layers. In the embodiment illustrated in FIG. 7, the conductive layers comprise a titanium layer, a palladium layer, and a silver layer, deposited in that order. The total thickness of these layers is about 30,000 Å in the illustrated embodiment. As noted above, this sequence of layers minimizes contact resistance, while providing superior adhesion among the various materials. The titanium, which is electrically compatible with doped silicon regions, also provides a barrier to diffusion of contaminating metal atoms from the upper conductive layers and to outward diffusion of dopants from the N+ and P+ regions. One of skill in the art of semiconductor fabrication will also recognize other combinations of conductive layers which will satisfy these considerations.

The filled vias represent the contact portions 114 of the electrodes, which is spaced from the illustrated front opaque layer 130 (FIG. 7).

The front side of the partially fabricated photodiode is then masked and etched 166 to define the cap portions 118 of the electrodes 106, 108 (FIG. 7). Desirably, the mask openings for defining the cap portions 118 are wider than the mask openings which were used to define the contact vias at step 162. Advantageously, the mask openings are slightly wider than the openings in the front opaque layer 130 (0.014 inch by 0.104 inch in the given example). The shadow cast by the cap portions thus minimizes light leakage from the front side through the gap between the opaque layer 130 and the contact portion 114 (FIG. 7).

The optical filter is then formed 172 by directly depositing one or more dielectric layers over the rear face. The filter materials are selected to filter out unwanted wavelengths of light while passing the desired wavelengths at a particular transmission level.

Since the electrodes 106, 108 (FIG. 7) are formed on the opposite face 105 of the substrate 101, the filter 139 need not be etched to make contact to the underlying substrate 101 and the filter can be constructed from a wide range of materials. In particular, hard filter materials can be used to accomplish high quality filtration while at the same time performing a protective function. Typical filter materials comprise dielectric stacks and/or metallic layers such as may be deposited by chemical or physical vapor deposition. Exemplary filter formation 172 includes oxide deposition by ion assisted chemical vapor deposition or sputtering, but it will be understood that other methods can be utilized in forming optical coatings of a hard, protective composition. As noted above, the preferred hard filter deposition 172 can be performed by any of a variety of optical filter providers.

If the photodiode is to include an additional opaque layer, such as the rear face opaque layer 142 of FIG. 7, this layer can be formed after filter formation 172. Alternatively, the entire rear face of the photodiode can be left exposed, or a light blocking structure can be formed after photodiode is mounted in its operational configuration, which is discussed below.

Figure 10:
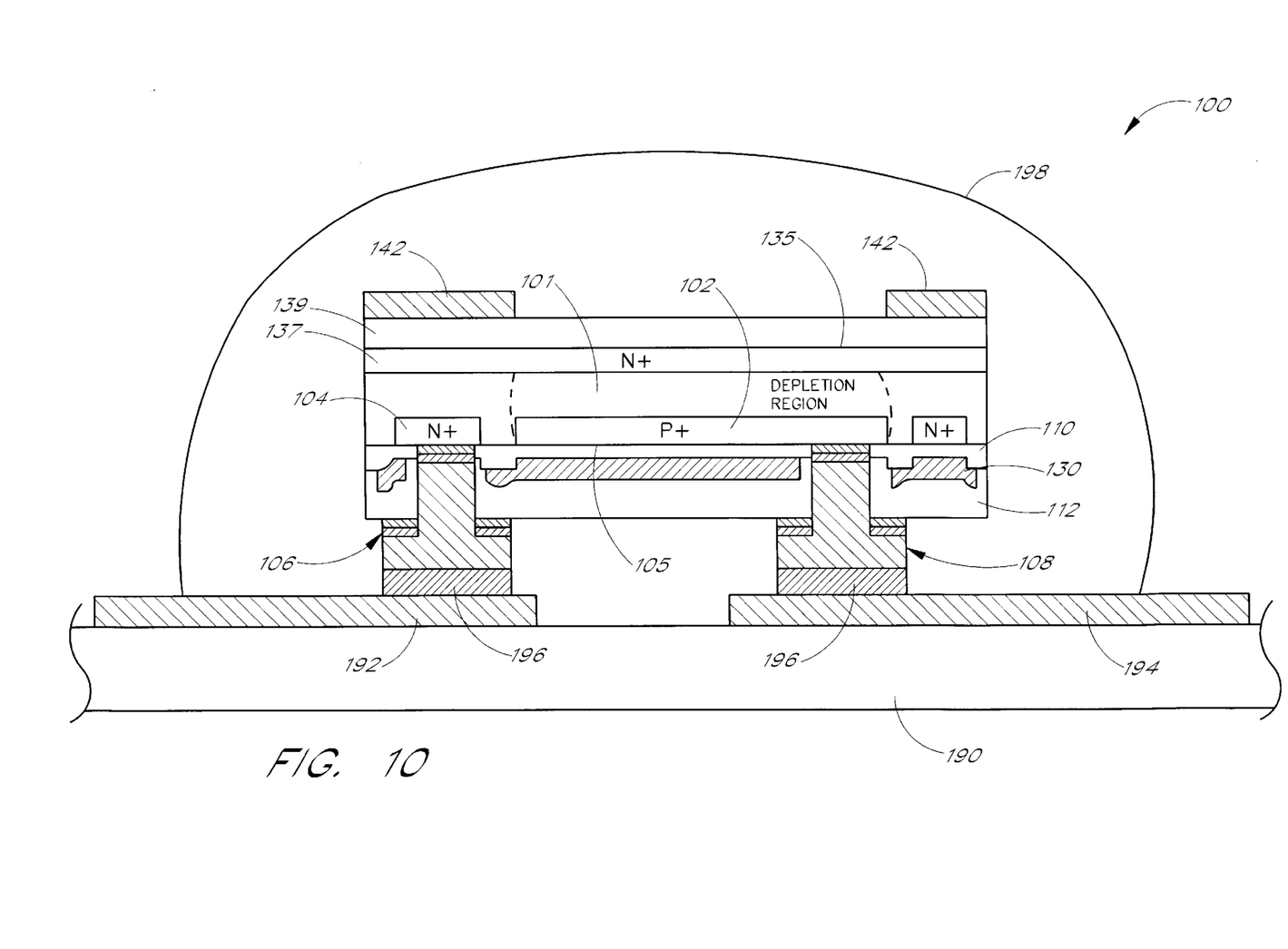
FIG. 10 is a schematic cross-section of the photodiode of FIG. 7, surface mounted upon a carrier with the rear face up.

Referring now to FIG. 10, the photodiode 100 of FIGS. 7 and 8 is illustrated in a surface mount or "flip chip" configuration over a circuit carrier 190. The drawing is merely schematic and dimensions are exaggerated for purposes of illustration. The carrier 190 can comprise any of a number of substrates, including, among others, ceramic substrates, flex cables, headers, leadframes, etc., with circuit traces or terminals exposed at the surface. The carrier 190 represents a circuit or PC board (PCB) in the illustrated embodiment, having at least two circuit elements 192, 194 exposed at the surface.

Preferably, the photodiode 100 is mounted upon the exposed circuit elements 192, 194 by way of a conductive adhesive 196. Examples of suitable conductive adhesives include solder, solder alloys, evaporated indium or conductive epoxies (e.g, Epotec™ H20E).

The photodiode 100 can be mounted to the carrier 190 by applying the conductive adhesive 196 to either the photodiode electrodes 106, 108 and/or to the exposed circuit elements 192, 194. For example, the photodiode 100 can be dipped into a solder pot, which will not adhere to the insulating layer 112 or other protective layer but will adhere to the preferred silver electrodes 106, 108. Alternatively, solder alloy or epoxy can be screen printed. The photodiode electrodes 106, 108 can also be adhered to the carrier circuit elements 192, 194 by evaporating indium, gold, or other metals or metal alloys onto the electrodes and/or the exposed circuit elements.

The photodiode 100 is then inverted or flipped and the electrodes 106, 108 aligned with the circuit elements 192, 194. The photodiode is then moved relative to the carrier 190 to make contact. Once the electrodes 106, 108 are in contact with the circuit elements 192, 194, the conductive adhesive 196 can be subjected to reflow and will set to bond the electrodes 106, 108 in electrical contact with the circuit elements 192, 194.

While illustrated with an integral rear opaque layer 142 to confine light to the portion of the rear face 135 adjacent the P+ active region 102, it will be understood that such an opaque structure can be mounted to the photodiode after surface mounting in other arrangements. For example, a metal bracket having an aperture therein can be applied over the rear side of the photodiode.

After mounting upon the carrier 190, the photodiode 100 can be packaged in an encapsulating member 198, as shown. The encapsulating member 198 preferably surrounds the photodiode 100, while the circuit elements 192, 194 protrude from the encapsulating member 198 to become a part of an external circuit (e.g., on the PC board). An exemplary encapsulating material is an optically clear plastic epoxy sold under the trade name Epotec™ 301-2, which can be injected over the photodiode 100 and carrier 190, holding its form by surface tension until the epoxy sets.

While such a material is moisture-resistant, the preferred hard coat filter 139 additionally protects the light-sensitive surface 135. It will be understood by one of skill in the art that the encapsulating member can also comprise a hermetically sealed cap, such as a metal transistor outline cap (e.g., gold-plated Kovar™) which is resistance-welded to the carrier on which the diode is mounted. Such a cap can also include a window adjacent light-sensitive surfaces of the photodiode.

Advantageously, the preferred surface mounted photodiode 100 includes an integral filter 139 directly deposited on a substrate rear face 135 which is free of electrodes. The filter materials are thus not limited by a need to etch through the filter 139 and can be hard enough to perform a protective function, particularly prior to encapsulation. Even after the packaging, the filter 139 can supplement the protective function of packaging, such that a low cost encapsulating material can be used without unduly compromising the integrity of the photodiode 100.

Furthermore, the photodiode 100 can be made sensitive to select wavelengths of light within an integral, compact and convenient package, having a lower profile and fewer parts than photodiodes with independent filters. These features provide a structure which is less susceptible to vibrations, light leakage, and contamination prior to encapsulation, in contrast to photodiodes having independent filters. Independent filters which are fixed to the photodiode after mounting can be more expensive to produce due to low yield and material losses, and involve separate assembly steps. Additionally, adhesives between the independent filter and the substrate can easily form bubbles during the adhesion process, which tends to alter the transmission spectrum.

The preferred configuration also facilitates surface mounting the photodiode 100 on circuit carriers, such as PC boards. Electrical contact to circuit traces can be made from a single side of the substrate 101, due to the preferred electrode configuration. Moreover, enlarged cap portions 118 of the electrodes 106, 108 serve to aid alignment during surface mounting, as well as prevent light leakage to the front face 105. Compared to front entry configurations, the surface mounted rear entry configuration advantageously decreases manufacturing costs, while improving quality and reliability. The rear entry feature also improves stability and quantum efficiency for light in the ultraviolet range (e.g., 200–350 nm).

Figure 11:
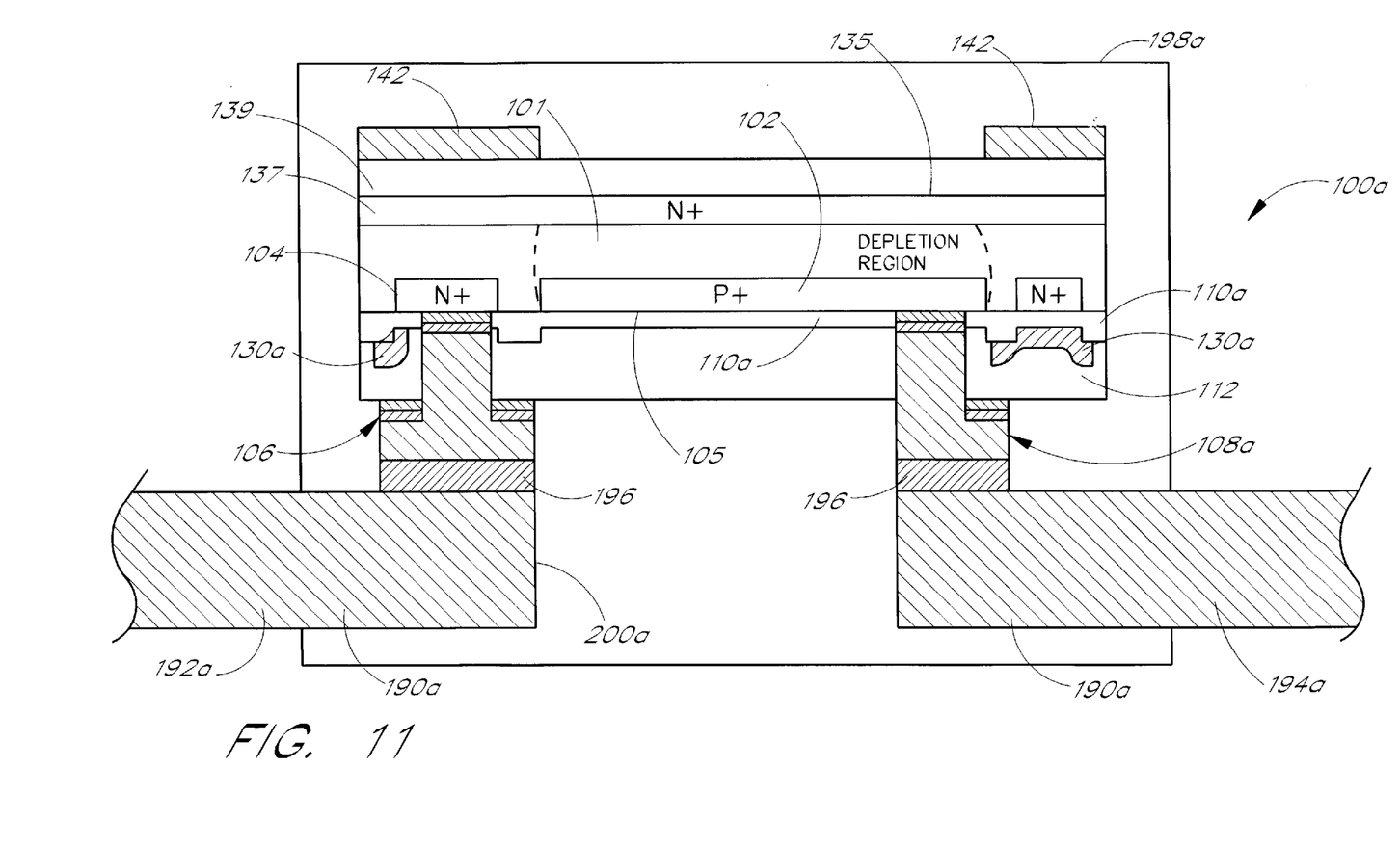
FIG. 11 is a schematic cross-section of a double-sided photodiode, in accordance with another surface mount embodiment.

Referring now to FIG. 11, a double-sided, light-sensitive photodiode 100a is shown in accordance with another surface mount embodiment. As many components of the photodiode 100a are similar to the photodiode 100 of FIGS. 7–10, like components will be referred to by like reference numerals, with the suffix "a" added to significantly altered components and to new components.

The rear face 135 of the double-sided embodiment can be identical to that of the previous embodiment (e.g., depletion-stop region 137, filter 139, opaque layer 142, etc.). The structure of layers over the front face 105, however, is configured slightly differently in order to permit light detection at the front side. Thus, for example, the front opaque layer 130a does not extend over the P+ active region 102. Additionally, the passivation layer portion of the insulating layer 110a can be provided in a thickness appropriate to serve as an anti-reflection layer in the region over the P+ active region 102.

The circuit carrier 190a is also configured differently in order to allow light to reach the P+ active region 102 through the front face 105. In the illustrated embodiment, carrier 190a comprises a lead frame which defines an aperture 200a aligned with the P+ active region 102 when the photodiode 100a is surface-mounted. The aperture 200a can be made wide to maximize exposure of the P+ active region 102 to front-side light by configuring the P+ contact electrode 108a in an L-shaped configuration, rather than a T-shaped configuration.

As with the surface mount embodiment of FIG. 10, the photodiode 100a is packaged in an encapsulating member 198a after mounting. For the illustrated embodiment, the encapsulating member 198a comprises a low cost optically clear plastic, transfer molded around the photodiode 100a and adjacent portions of the lead frame. As will be understood, the lead frame serves as both the carrier 190a and circuit elements 192a, 194a, protruding from the encapsulating member 198a to make electrical contact to an external circuit. An exemplary cost-efficient material for the encapsulating member 198a is available under the trade name Dexter Hysol™ MG-18. One of skill in the art will recognize, however, other manners of packaging the surface mounted photodiode.

The photodiode 100a can thus communicate with a light source through the aperture 200a, for example, thereby providing optical communication while maintaining electrical isolation. Additionally, as described with respect to FIG. 6, the double-sided embodiment can be used to distinguish data signals from intensity fluctuations of the light source. Thus, for example, the filtered or rear side 135 can serve as a communication channel, while the front side 105 serve as a reference channel for measuring intensity variations in the light source, thereby ensuring that the device remains calibrated during operation.

Although the foregoing invention has been described in terms of certain preferred embodiments, other embodiments will become apparent to those of ordinary skill in the art, in view of the disclosure herein. Accordingly, the present invention is not intended to be limited by the recitation of preferred embodiments, but is instead intended to be defined solely by reference to the appended claims.

We claim:

1. A semiconductor photodiode mounted upon a circuit carrier, comprising a light sensitive semiconductor substrate with a front surface and a rear surface, an integral light filter extending across the rear surface, and a plurality of electrodes extending from the front surface, each of the electrodes bonded to a circuit element on the carrier with the rear surface facing away from the carrier, wherein the semiconductor substrate comprises a silicon wafer of a first conductivity type, having an active region of a second conductivity type extending from the front surface into the substrate, at least one of the electrodes electrically connected to the active region at the front surface, and wherein the semiconductor substrate further comprises a contact region of the first conductivity type extending from the front surface into the substrate, at least one of the electrodes electrically connected to the contact region at the front surface.

2. The photodiode of claim 1, wherein the electrodes are bonded to the circuit elements by a conductive adhesive.

3. The photodiode of claim 2, wherein the conductive adhesive comprises a solder.

4. A semiconductor photodiode mounted upon a circuit carrier, comprising a light sensitive semiconductor substrate with a front surface and a rear surface, an integral light filter extending across the rear surface, and a plurality of electrodes extending from the front surface, each of the electrodes bonded to a circuit element on the carrier with the rear surface facing away from the carrier, wherein the semiconductor substrate comprises a silicon wafer of a first conductivity type, having an active region of a second conductivity type extending from the front surface into the substrate, at least one of the electrodes electrically connected to the active region at the front surface, and wherein the semiconductor substrate further comprises a depletion stop region of the first conductivity type extending from the rear surface into the substrate.

5. The photodiode of claim 4, wherein the semiconductor substrate comprises a silicon wafer.

6. A semiconductor photodiode mounted upon a circuit carrier, comprising a light sensitive semiconductor substrate with a front surface and a rear surface, an integral light filter extending across the rear surface, and a plurality of electrodes extending from the front surface, each of the electrodes bonded to a circuit element on the carrier with the rear surface facing away from the carrier, wherein the semiconductor substrate comprises a silicon wafer of a first conductivity type, having an active region of a second conductivity type extending from the front surface into the substrate, at least one of the electrodes electrically connected to the active region at the front surface, and a rear light blocking structure over a portion of the filter, defining an exposed portion of the filter aligned with the active region.

7. The photodiode of claim 6, wherein the carrier comprises a PC board.

8. The photodiode of claim 6, wherein the rear light blocking structure comprises an opaque layer integral with and overlying the filter, the opaque layer having an aperture therein.

9. A semiconductor photodiode mounted upon a circuit carrier, comprising a light sensitive semiconductor substrate with a front surface and a rear surface, an integral light filter extending across the rear surface, and a plurality of electrodes extending from the front surface, each of the electrodes bonded to a circuit element on the carrier with the rear surface facing away from the carrier, and a front light blocking structure preventing light from entering the front face.

10. The photodiode of claim 9, wherein the filter is characterized by a bandpass of 80% transmission of light between about 700 nm and 750 nm.

11. The photodiode of claim 9, further comprising a front face passivating layer, wherein the front light blocking structure comprises an opaque layer embedded in the passivating layer.

12. The photodiode of claim 11, wherein the embedded opaque layer comprises metal spaced from the electrodes.

13. The photodiode of claim 12, wherein the electrodes include a wider cap region overlying the passivating layer and overlapping with the opaque layer to prevent light from entering the front face.

14. A semiconductor photodiode, comprising:
   a semiconductor substrate having a front face and a rear face opposite the front face, an active region of a first conductivity type extending from the front face into the substrate, a body region of a second conductivity type immediately adjacent the active region within the substrate, the active region and the body region defining a PN junction therebetween;
   a first electrode extending from the front face at the active region;
   a second electrode extending from a region on the front face located on one side of and not surrounding the active region;
   an opaque layer over said front face to preclude light therefrom; and
   an integral light filter extending across the rear face of the substrate.

15. The photodiode of claim 14, wherein the semiconductor substrate comprises a silicon wafer.

16. The photodiode of claim 14, further comprising a rear opaque layer integral with and overlying the filter, the opaque layer having an aperture therein for confining light to a portion of the rear face adjacent the active region.

17. The photodiode of claim 14, wherein the body region is n-type and the active region is p-type.

18. The photodiode of claim 17, further comprising an N+ contact region adjacent the active region, the contact region extending from the front face into the substrate.

19. The photodiode of claim 14, wherein the opaque layer is integrally formed with the substrate and surrounded by an insulating layer.

20. A semiconductor photodiode mounted upon a circuit carrier, comprising a light-sensitive semiconductor substrate with a front face toward the carrier and a rear face away from the carrier, an integral light filter extending across the rear face, an electrically-doped active region extending from the front face into the substrate, the carrier having an aperture formed therethrough aligned with and optically communicating with the active region at the front face.

21. The photodiode of claim 20, wherein a plurality of integral electrodes extend from the front face of the substrate.

22. The photodiode of claim 21, wherein each of the electrodes are bonded to a circuit element on the carrier.

23. The photodiode of claim 22, wherein one of the electrodes is formed on one side of and not surrounding the active region, and another of the electrodes extends from the active region at the front face.

24. The photodiode of claim 20, further comprising a rear opaque layer integral with an overlying the filter, the opaque layer having an aperture therein aligned with and optically communicating with the aperture therein for confining light to a portion of the rear face adjacent the active region.

25. A semiconductor photodiode mounted upon a circuit carrier, comprising a light sensitive semiconductor substrate with a front surface and a rear surface, an integral light filter extending across the rear surface, and a plurality of electrodes extending from the front surface, each of the electrodes bonded to a circuit element on the carrier with the rear surface facing away from the carrier, wherein the semiconductor substrate comprises a silicon wafer of a first conductivity type, having an active region of a second conductivity type extending from the front surface into the substrate, at least one of the electrodes electrically connected to the active region at the front surface, and wherein another of the electrodes extends from the front surface on one side of the active region.

* * * * *